(12) United States Patent
Hoeft

(10) Patent No.: US 12,313,658 B2
(45) Date of Patent: May 27, 2025

(54) CURRENT MEASUREMENT APPARATUS FOR MEASUREMENT VALUE ACQUISITION, CURRENT SENSOR, AND CURRENT MEASUREMENT TRANSDUCER

(71) Applicant: Phoenix Contact GmbH & Co. KG, Blomberg (DE)

(72) Inventor: Wolfgang Hoeft, Barntrup (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 86 days.

(21) Appl. No.: 18/016,878

(22) PCT Filed: Jul. 21, 2021

(86) PCT No.: PCT/EP2021/070375
§ 371 (c)(1),
(2) Date: Jan. 19, 2023

(87) PCT Pub. No.: WO2022/018132
PCT Pub. Date: Jan. 27, 2022

(65) Prior Publication Data
US 2023/0349954 A1    Nov. 2, 2023

(30) Foreign Application Priority Data
Jul. 22, 2020   (DE) .......................... 102020119340.8

(51) Int. Cl.
*G01R 15/08*   (2006.01)
*G01R 15/20*   (2006.01)
*G01R 19/32*   (2006.01)

(52) U.S. Cl.
CPC .......... *G01R 15/202* (2013.01); *G01R 15/08* (2013.01); *G01R 19/32* (2013.01)

(58) Field of Classification Search
CPC ....... G01R 15/202; G01R 15/08; G01R 19/32
(Continued)

(56) References Cited

U.S. PATENT DOCUMENTS

| 4,829,239 A | 5/1989 | Holstein et al. |
| 5,790,046 A | 8/1998 | Blossfeld |

(Continued)

FOREIGN PATENT DOCUMENTS

| DE | 4422867 A1 | 1/1996 |
| DE | 10307704 A1 | 10/2003 |

(Continued)

OTHER PUBLICATIONS

Micronas "HAL815 Programmable Linear Sensor", Nov. 10, 2000 (Nov. 10, 2000), Retrieved from the Internet: URL:www.ortodoxism.ro/datasheets/MicronasIntermetall/mXyzvryz.pdf XP002348821 [retrieved on Oct. 12, 2005] 4. Application notes; 2.1. General Function; 2.2. Digital Signal Processing and EEPROM; figures 2-2, 2-3, 4-1.

*Primary Examiner* — Raul J Rios Russo
*Assistant Examiner* — Trung Q Nguyen
(74) *Attorney, Agent, or Firm* — LEYDIG, VOIT & MAYER, LTD.

(57) ABSTRACT

A current measurement apparatus for measurement value acquisition includes: a current sensor; and a current measurement transducer. A measurement range of the current sensor is adjustable. The current sensor includes at least one magnetic field sensor having at least one matching circuit and a memory. The current measurement transducer includes an input interface for inputting and/or a communication interface for transmitting information with respect to measurement range switching. The current measurement transducer includes an output interface for outputting the measurement values. The measurement range switching for the current sensor is based on the matching circuit accessing at least one new matching value in the memory, by which a change of the measurement signal of the magnetic field sensor is adjustable.

14 Claims, 4 Drawing Sheets

(58) Field of Classification Search
USPC .......................................................... 324/117
See application file for complete search history.

(56) References Cited

U.S. PATENT DOCUMENTS

| | | |
|---|---|---|
| 2003/0169031 A1 | 9/2003 | Viola |
| 2005/0073293 A1 | 4/2005 | Hastings et al. |
| 2006/0291856 A1 | 12/2006 | Hampel |
| 2011/0224937 A1 | 9/2011 | Nishimura |
| 2012/0144909 A1* | 6/2012 | Dreyer ..................... H02P 9/00 |
| | | 73/118.01 |
| 2019/0128972 A1 | 5/2019 | Raghavan et al. |
| 2019/0229640 A1* | 7/2019 | Aichriedler ........... H02M 7/003 |
| 2020/0096542 A1* | 3/2020 | Tsuzaki ................ G01R 15/207 |
| 2020/0102902 A1* | 4/2020 | Piche .................. F02D 41/1453 |
| 2020/0191835 A1 | 6/2020 | Bilbao De Mendizabal et al. |
| 2020/0295728 A1* | 9/2020 | Toya .................... H03H 7/0153 |
| 2020/0335982 A1* | 10/2020 | Lopez ................... H02J 7/0029 |
| 2021/0057931 A1* | 2/2021 | Regazzi ............... G01R 15/202 |

FOREIGN PATENT DOCUMENTS

| | | |
|---|---|---|
| DE | 10305986 A1 | 9/2004 |
| DE | 112011100177 T5 | 11/2012 |
| DE | 102015223088 A1 | 5/2017 |
| DE | 102018218131 A1 | 5/2019 |
| DE | 102019133922 A1 | 6/2020 |
| KR | 101974308 B1 | 4/2019 |

\* cited by examiner

CURRENT MEASUREMENT APPARATUS FOR MEASUREMENT VALUE ACQUISITION, CURRENT SENSOR, AND CURRENT MEASUREMENT TRANSDUCER

CROSS-REFERENCE TO PRIOR APPLICATIONS

This application is a U.S. National Phase application under 35 U.S.C. § 371 of International Application No. PCT/EP2021/070375, filed on Jul. 21, 2021, and claims benefit to German Patent Application No. DE 10 2020 119 340.8, filed on Jul. 22, 2020. The International Application was published in German on Jan. 27, 2022 as WO/2022/018132 under PCT Article 21 (2).

FIELD

The invention relates to a current measurement apparatus for measurement value acquisition. The invention likewise relates to a current sensor, which can be contained in a current measurement apparatus according to the invention, as well as a current measurement transducer, which can be part of the current measurement apparatus.

BACKGROUND

Such current measurement apparatuses are used in many different ways in the field of industrial automation. The acquisition of energy data, such as current and voltage, is used in automation technology, in process technology and process engineering, as well as generally for wear detection of machinery and plants, including robots and power plants.

In wind turbines, the current measurement apparatus can be used, for example, for monitoring purposes, in particular to monitor the pitch adjustment of the rotor blades. The analog output signal is not further transmitted there but is processed and used directly in the control unit of the wind turbine. A further application example relates to the measurement of the current generated by solar modules.

In the case of another application, it is possible to use the current measurement apparatuses on the periphery of field bus systems. Field bus systems are used in automation technology, in process technology and process engineering, as well as generally to control machinery and plants, including robots. There, they are used for measurement value acquisition of sensors as well as for outputting switching signals for controlling plants.

In the case of laboratory measurement apparatuses, an automatic measurement range switching has been customary for some time for the voltage measurement or current measurement. The measurement range switching runs in the background so that the user does not notice this or only notices very little. As an example, laboratory measurement apparatuses have only one connection point for current or voltage inputs, internal amplifiers switch or amplify, respectively, the measurement signal accordingly, so that the best range with the smallest possible error is always used.

In the case of current measurement apparatuses for industrial and plant construction use, however, the existing solutions for the automatic range switching are too complex and too expensive.

In the case of such industrial measurement apparatuses, it is customary to realize different current measurement ranges via individual clamps. If it does happen then that one clamping point is used twice, a complete second measurement branch with switching via, e.g. DIP switches, is then generally necessary. However, there are also measurement apparatuses, which use a type of window technique in order to enlarge a smaller range by means of zoom operation within a larger measurement range. For example, a 10 A current measurement range can thus represent a 1 A measurement range. In this case, however, a large portion of the resolution resulting from acquisition of the signal with the help of an A/D converter is lost. Specifically, this means a loss of the measurement accuracy by a factor of 10. A further disadvantage is that 10-times more noise occurs in the signal due to the amplification of the measurement signal by the factor of 10.

It is known from the document DE 4422867 A1 to program switching thresholds of a Hall switch. However, this Hall switch is not used for current measurement.

A measuring system for medium- or high-voltage plants with optical signal transmission between sensor head and a central measurement apparatus is known from the document DE 10305986 A1, in the case of which a measurement range switching is performed in the sensor head. This takes place by means of a microprocessor, which communicates with a differential amplifier in the sensor head.

However, the known solutions have the disadvantage that they are either too complex for industrial measurement apparatuses or do not relate to a current sensor.

SUMMARY

In an embodiment, the present invention provides a current measurement apparatus for measurement value acquisition, comprising: a current sensor; and a current measurement transducer, wherein a measurement range of the current sensor is adjustable, wherein the current sensor includes at least one magnetic field sensor comprising at least one matching circuit and a memory, wherein the current measurement transducer includes an input interface for inputting and/or a communication interface for transmitting information with respect to measurement range switching, wherein the current measurement transducer includes an output interface for outputting the measurement values, and wherein the measurement range switching for the current sensor is based on the matching circuit accessing at least one new matching value in the memory, by which a change of the measurement signal of the magnetic field sensor is adjustable.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
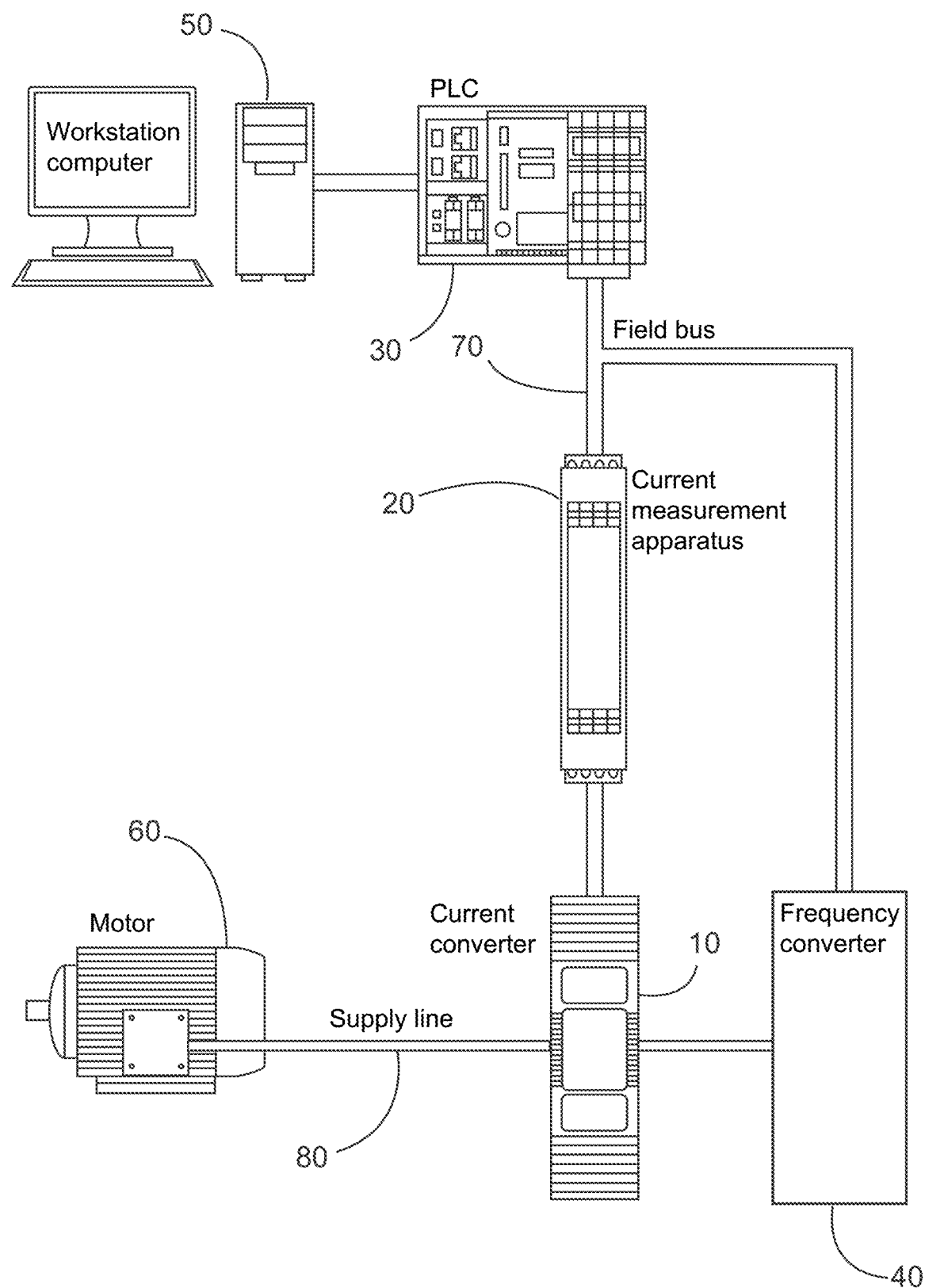
FIG. 1 shows a field bus system comprising the components current measurement apparatus and control unit, in the case of which the current measurement apparatus acquires the load current of an electric motor.

In an embodiment, the present invention provides improved current measurement apparatuses, which avoid these mentioned disadvantages. The behavior of the current sensor with respect to the accuracy and the proportional measurement value acquisition is improved thereby.

According to the invention, the measurement range switching takes place directly in the current sensor of the current measurement apparatus. This is possible in the case of current sensors, which are equipped with magnetic field sensor, e.g. Hall probes. The Hall probes are already also equipped with integrated circuits, which expands the application range thereof. For this purpose, a matching by means of programming is required. However, this programming is currently still a process, which is performed once either at the manufacturer or at the user during installation.

The one-time determination of the measurement range within the sensor at the manufacturer is typically only optimized for one current measurement range. However, if the terminal (current measurement apparatus) is to have two, three, or more current measurement channels, external amplifiers (operation amplifiers) are typically used. Any signal processing of these external amplifiers, however, means a loss of the measurement accuracy. By means of the solution according to the invention, it is possible to completely utilize the data sheet specifications of the sensor manufacturer (current sensor comprising Hall element) and to use the current sensor optimally for each possible measurement range.

This will now be described in more detail using two examples:

Case 1:

A current magnitude of 10 A on a power line can correspond to a flux of, e.g., 100 mT. In a current sensor comprising a Hall element, an output voltage of 1 V is then generated. This then lies within the accuracy range in the data sheet of the current sensor specified by the manufacturer (e.g. 0.2% accuracy).

Case 2:

Now, a second measurement channel is constructed, e.g. wherein a current to be measured is to be measured up to 1 A. This means a magnetic flux of only 10 mT and generates a voltage amplitude of 100 mV at the output. This signal of 100 mV has to now be amplified by the factor of 10 by means of an amplifier, which is connected downstream. This means a larger measurement error than in the first case because the measurement error is also amplified accordingly.

The transmission ratio of mT to mV within the current sensor is changed by means of the solution according to the invention, whereby this problem can be solved. If the user wants to measure a different, e.g. smaller, current by means of the measurement apparatus, the current sensor is proportionally reprogrammed in such a way that a flux of 10 mT now results in an output amplitude of 1 V. With this transmission ratio, the data relating to the measurement accuracy of, e.g., 0.2%, as specified by the current sensor manufacturer also still apply.

According to the invention, a switching during the runtime of the measurement system is realized. This switching/reprogramming is supported by a microcontroller in the current measurement apparatus. The user can request the measurement range switching via the input interface or the communication interface. It is possible here to offer several predefined measurement ranges to the user, or it is realized in such a way that the user himself can define any measurement ranges, which can be acquired by the current sensor. Due to the continuous measurement range switching in the current sensor, a possible dynamic range of a factor of, e.g., 30, can be realized without having to accept a larger measurement error or without generating additional noise.

In a first embodiment, the invention relates to a current measurement apparatus for measurement value acquisition comprising a current sensor and a current measurement transducer, wherein the measurement range of the current sensor can be adjusted. The current sensor is equipped for this purpose with at least one magnetic field sensor and at least one matching circuit and a memory. A special feature is that the measurement range switching for the current senor is based on that by reprogramming the memory, the matching circuit accesses at least one new matching value in the memory, by means of which a change of the measurement signal of the magnetic field sensor can be adjusted. This reprogramming can then be performed any number of times as part of the specified write cycle number of the memory. Even a dynamic measurement range switching can be realized therewith. The information about the measurement range switching can take place via an input interface. The output of the measurement values can take place via an output interface. The input interface and/or the output interface can also be configured as communication interface.

It is advantageous for the current measurement apparatus when the at least one matching circuit corresponds to an amplifying circuit, the amplification factor of which is determined by means of the at least one new matching value in the memory. It is thus possible to utilize the complete resolution of the A/D converter, which acquires the measurement signal.

To further improve the matching, it is advantageous when the at least one matching circuit has a compensation circuit, the compensation value of which is determined by means of the at least one new matching value in the memory.

The compensation value can thereby correspond to an offset value, by means of which the offset of the measurement signal due to the occurrence of an interfering direct current, e.g. due to production-related component scattering, is compensated.

To improve the matching, it is advantageous in another variation when the compensation value corresponds to a correction value for a correction voltage, by means of which the offset of the measurement signal due to the occurrence of a temperature change is compensated. This can additionally take place to compensate the interfering direct current. It is advantageous for this purpose when the current sensor is equipped with a temperature probe, the signal of which is output analogously or digitally to the current measurement transducer, which can then perform the corresponding reprogramming for the temperature compensation.

The memory should be writable as often as possible. It is advantageous for this purpose when an EEPROM memory or a flash EPROM memory is used as non-volatile memory. They offer specified write cycle numbers of up to 100,000 write cycles. In addition, a CMOS RAM memory could also be used, for which no limited write cycle number is specified. The use of other memory components, e.g. dynamic RAM memories would also be possible. However, it would then need to be ensured that the memory is constantly supplied with current.

The interface, via which the matching values are transmitted to the current sensor, can advantageously be designed as communication interface, in particular Inter-IC bus interface I2C.

It is particularly advantageous when the magnetic field sensor contains at least one Hall element. Such magnetic field sensors can be adjusted particularly well to different measurement ranges via internal amplifiers.

There are a large variety of possible uses for the current measurement apparatus. The use for measuring the current generated by one or several solar modules is mentioned as an important example.

In another embodiment, the invention relates to a current sensor for a current measurement apparatus. Said current sensor has a magnetic field sensor comprising at least one matching circuit. The current sensor furthermore has a memory and an interface, via which at least one new matching value for the measurement range switching of the magnetic field sensor can be received by a current measurement transducer, and a memory addressing unit, via which the at least one received matching value can be written into the memory. The measurement range switching can thus be performed by the user, in that the user transmits the matching values to the current measurement transducer, which, in turn, transmits them to the current sensor. For non-volatile memories of the EPROM type, the memory addressing unit can be configured as programming logic.

It is likewise advantageous for the current sensor when the interface is designed as communication interface, in particular Inter-IC bus interface I2C.

A further embodiment of the invention relates to a current measurement transducer for a current measurement apparatus, wherein the current measurement transducer has a microcontroller and an output unit, via which the acquired current measurement values can be output digitally or analogously. The current measurement transducer has an input interface, via which the information for the measurement range switching can be input. The input interface can also comprise a communication interface, via which data with respect to the measurement range switching can be transmitted to the current measurement transducer. The communication interface can be a field bus interface or a radio interface. For this purpose, the current measurement transducer has a further interface and means for generating or for receiving at least one new matching value for the measurement range switching of a current sensor, wherein the microcontroller is designed to execute a computer program, and the computer program has programming steps, which, when executing the program by means of the microcontroller, prompt the latter to send the at least one new matching value via the interface to the current sensor. In a variation, a workstation computer can send the matching value to the current measurement transducer. In another variation, a measurement range specification can be transmitted to the current measurement transducer and the current measurement transducer generates the at least one corresponding matching value therefrom.

It is also advantageous for the current measurement transducer when the further interface is designed as communication interface, in particular Inter-IC bus interface I2C.

As described, the invention offers the advantage that the current measurement apparatuses no longer have to have this plurality of clamping points for the different measurement ranges. On the other hand, it becomes possible to provide the clamping points, which become available in this way, for expanded functions (interfaces for Industry 4.0). A possible error source for the user is furthermore eliminated on the product. It cannot happen that the user can select an incorrect clamping point for the current input and that the controller incorrectly determines the load current, which can lead to the destruction or to the overloading of the apparatus, which is to be controlled. New options for improving the accuracy of the control additionally result because the measurement range can be adjusted more frequently.

The present description illustrates the principles of the disclosure according to the invention. It thus goes without saying that experts will be able to design various arrangements, which are not described explicitly here but which embody principles of the disclosure according to the invention and the scope of which is to likewise be protected.

FIG. 1 shows a simple field bus system comprising only a few components. A programmable logic controller (PLC) 30 is thereby connected to a frequency converter 40, which generates the three-phase current for the running of the electric motor 60. For example, the electric motor 60 is a three-phase asynchronous motor. The PLC 30 thereby controls the frequency converter 40, in that it transmits the corresponding control commands via the field bus 70 to the frequency converter 40. The principle of field bus systems is that the measurement value acquisition takes place by means of an input/output unit on location for the various sensors of the machine or plant, but the control of the machine or plant takes place in the control unit 30, which is arranged centrally. The I/O data is transmitted to the control unit 30 via the field bus 70. The various known field bus variations are possible as field bus. Examples of field bus systems are Interbus, Profibus, Profinet, Ethernet, EtherCAT, CAN bus, HART, etc., Additional components can also be connected to the field bus 70. A hybrid motor starter (not illustrated) is mentioned as example, which fulfills functions, such as motor start-up, turning function, motor protection, and emergency stop. In addition, the load current, with which the electric motor 60 is driven, has to be monitored continuously, so that the PLC 30 can fulfil its control task. A current measurement apparatus 20, which acquires the load current and provides it to the PLC 30, serves this purpose. A current converter 10, which converts the high load current in the electric motor 60 from, e.g., 200 A AC primary current into a secondary current, which can be acquired more easily by means of measuring, e.g. a secondary current of 1 A AC, is connected upstream of the current measurement apparatus. This 1 A current signal is transmitted to the current measurement apparatus 20 and can be measured there by means of an internally installed current sensor (Hall element comprising ASIC).

The current measurement apparatus 20 will be discussed in more detail below.

Figure 2:
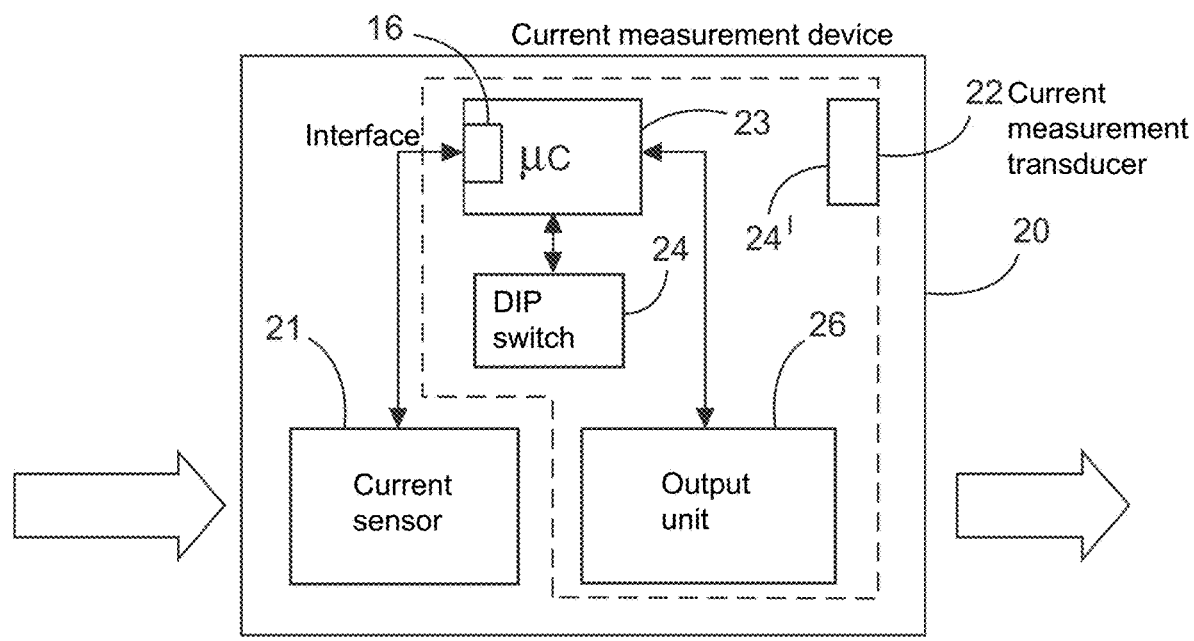
FIG. 2 shows a block diagram of the current measurement apparatus.

Die FIG. 2 shows a block diagram of the novel current measurement apparatus 20. The current measurement apparatus 20 is thereby illustrated so that it consists essentially of the two components current sensor 21 and current measurement transducer 22, which are connected to one another. However, both components current sensor 21 und current measurement transducer are accommodated in one housing. The power cable coming from the current converter 10 is typically guided through an opening in the housing.

In FIG. 2, reference numeral 22 identifies the current measurement transducer. In the case of this variation, current measurement transducer 22 and current sensor 21 are accommodated in a single housing. This is illustrated in FIG. 2. In addition to current sensor 21 and current measurement transducer 22, DIP switches 24 are shown, which can also be part of the current measurement transducer 22. Said switches can be used to adjust the base configuration of the current measurement transducer 22. This refers, e.g., to the configuration of the outputs of the current measurement transducer 22. Reference numeral 26 identifies an output module of the current measurement transducer 22. As example, analog outputs and digital outputs, which can be selected via the DIP switches 24, can be contained therein. A communication interface 24' is furthermore provided. The latter can correspond to a field bus interface, as described above. In the example shown in FIG. 1, the measurement results are output via the communication interface 24' and are transmitted to the controller 30. This takes place via the field bus 70 as described.

Figure 3:
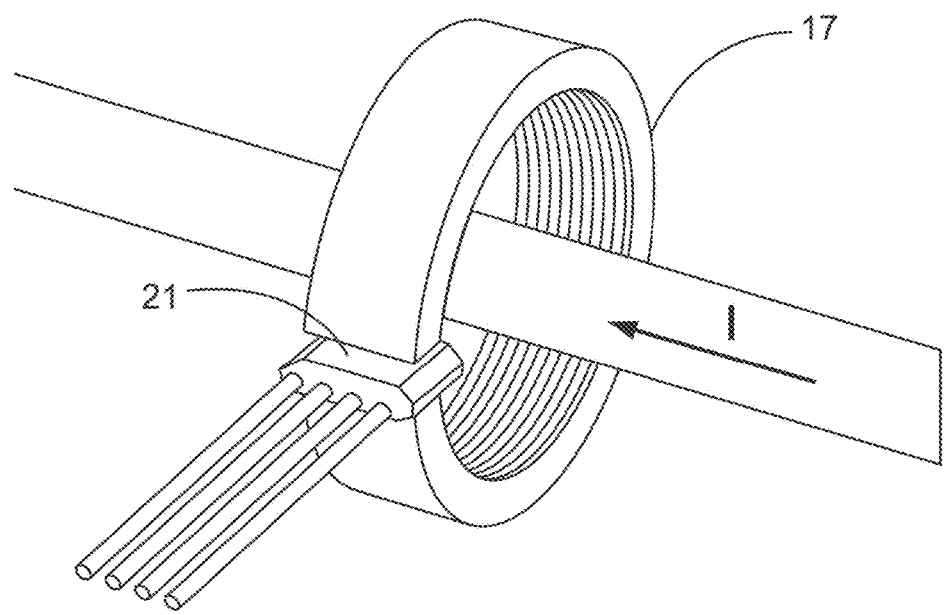
FIG. 3 shows a schematic diagram of a current sensor.

A schematic diagram of a current sensor 21 of this type is shown in FIG. 3. The measuring principle of such current sensors 21 is based on the physical effect of the measurement of the magnetic field, which surrounds the power cable when a current flows through it. This magnetic field can be acquired by means of one or several Hall elements. The alternating current, which flows through the power cable, can thus be acquired by means of measuring because the alternating current generates a variable magnetic field, which generates a voltage in the Hall elements. The Hall elements are also able to acquire direct currents. In order to amplify the magnetic field and to shield it against external influences, field concentrators 17 can be used in many applications. These are ferromagnetic annular bodies, which direct the magnetic field towards the Hall elements. As illustrated in FIG. 3, the Hall elements with the electronics are arranged in an air gap, which is provided in the field concentrator 17.

The Hall elements are made of thin semiconductor chips. A voltage is applied at the ends of the semiconductor chip so that a measurement current flows through the semiconductor chip. The semiconductor chip is attached in the current sensor 21 so that the magnetic field lines run as vertically as possible through the chip. A voltage, which is acquired and which provides information about the current magnitude, is thus created at the two measuring contacts of the semiconductor chip due to the force on the charge carriers.

Figure 4:
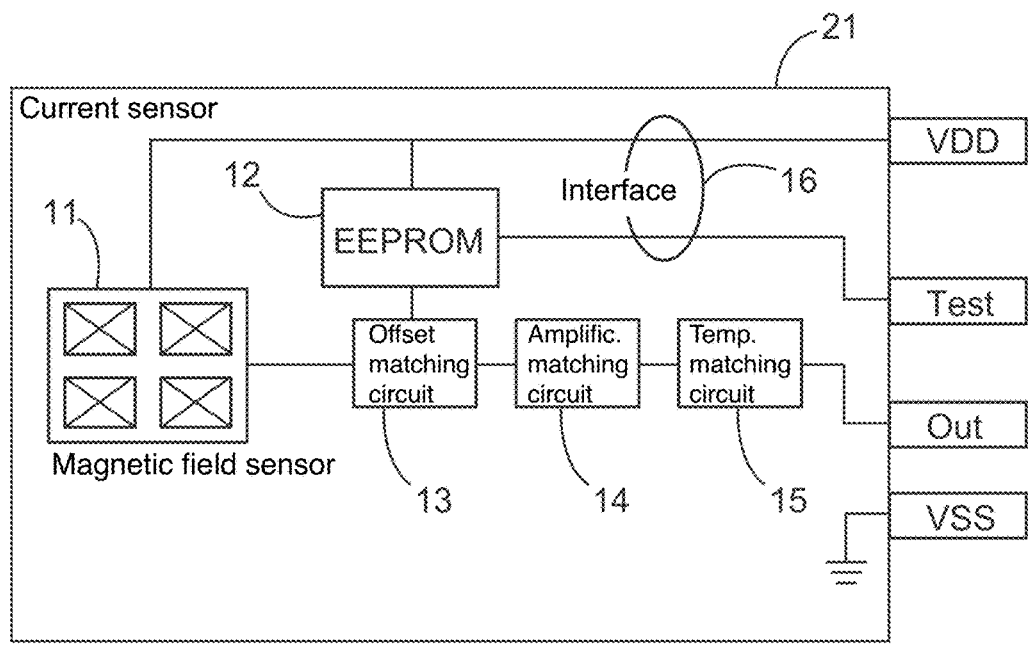
FIG. 4 shows a detailed block diagram of the current sensor of the current measurement apparatus.

FIG. 4 shows a block diagram of the current sensor 21. Reference numeral 11 identifies a Hall probe comprising 4 Hall elements. The Hall probe 11 is to be able to measure the current through the power supply line 80 over a wide measurement range. According to the invention, this is solved as follows: For this purpose, the current sensor 21 is equipped with different matching circuits. Reference numeral 13 identifies an offset matching circuit. A direct current can thus be applied to the measurement signal in order to compensate for a production related series scattering of the Hall probes 11. Reference numeral 14 identifies an amplification matching circuit. The behavior of the measuring amplifier (not illustrated separately) is adjusted therewith. For example, the amplification factor can be adjusted via this. Reference numeral 15 furthermore identifies a temperature matching circuit. On the one hand, the temperature can be measured therewith and, as a function thereof, the temperature dependency of the Hall voltage can be compensated. It is thus shown that at least offset matching and amplification matching have to be changed for switching the measurement range of the Hall probe 11. However, this can even also relate to the temperature matching. FIG. 4 also shows the terminals of the current sensor 21, via which the current sensor 21 is connected to the current measurement transducer 22. The terminal VDD identifies the positive pole of the voltage, which is applied to the Hall probe 11. However, the supply voltage for the matching circuits 13, 14, 15 and the memory 12 is also supplied via this. VSS identifies the ground terminal. The analog measurement signal is output via the output "Out". This corresponds to the matched and temperature-compensated measurement signal of the Hall probe 11. The terminal "Test" serves the purpose of describing the memory 12.

According to the invention, the frequent switching is realized by reprogramming certain memory locations in the non-volatile memory 12, which the different matching circuits 13, 14, 15 access. The non-volatile memory 12 is thereby realized, e.g., as EEPROM memory. The latter permanently keeps the values, once they have been programmed in. In addition, the memory cells can be overwritten frequently. Inexpensive EEPROM memories permit approximately 10,000 write cycles before programming errors may occur. However, there are also more high-quality EEPROM memories, which even guarantee 100,000 write cycles.

The data to be programmed into the selected memory location is supplied via the input "Test". To be able to select the respective memory cell, the address of the memory location, which is to be programmed, is initially supplied via the input "Test". Then follows the data word, which is to be programmed in there. A communication interface, by means of which the communication protocol is supported, is then provided in the EEPROM memory 12 for this purpose. This is, e.g., the known I2C bus interface.

Figure 5:
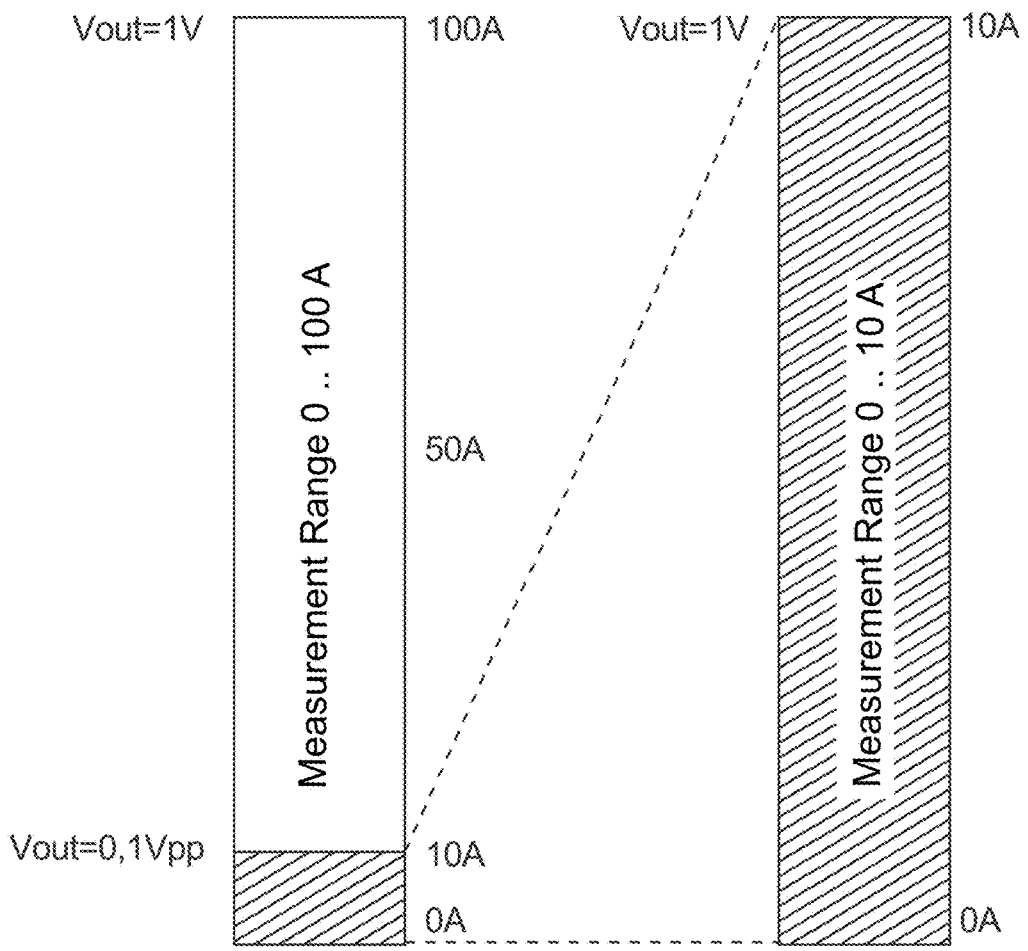
FIG. 5 shows a graphic for illustrating different measurement ranges of the current measurement apparatus.

FIG. 5 shows different measurement ranges of the current sensor 21. The current sensor 21 can maximally measure a current up to 100 A. For this measurement range, the current sensor 21 is adjusted ex works. For this measurement range, the measurement signal lies in the range of 0 . . . 1 V. However, there are many applications, in which this large measurement range is not required. This is why the measurement range of 0 to 10 A is emphasized in FIG. 5 as further measurement range. However, if the user of this current measurement apparatus 20 only wants to use 10 A for his application, it is disadvantageous to leave the matching unchanged. This would mean that the resolution of the analog-to-digital converter in the current measurement transducer 22 is much too low because it would only still convert the range of 0 . . . 0.1 V, while the resolution is set to the range of 0 . . . 1 V. This is why the user should change the matching in order to amplify the measurement signal, so that the measurement range of 0 . . . 10 A to the voltage range of 0 . . . 1 V is illustrated, so that the full resolution of the A/D converter is utilized in the current measurement transducer 22.

Figure 6:
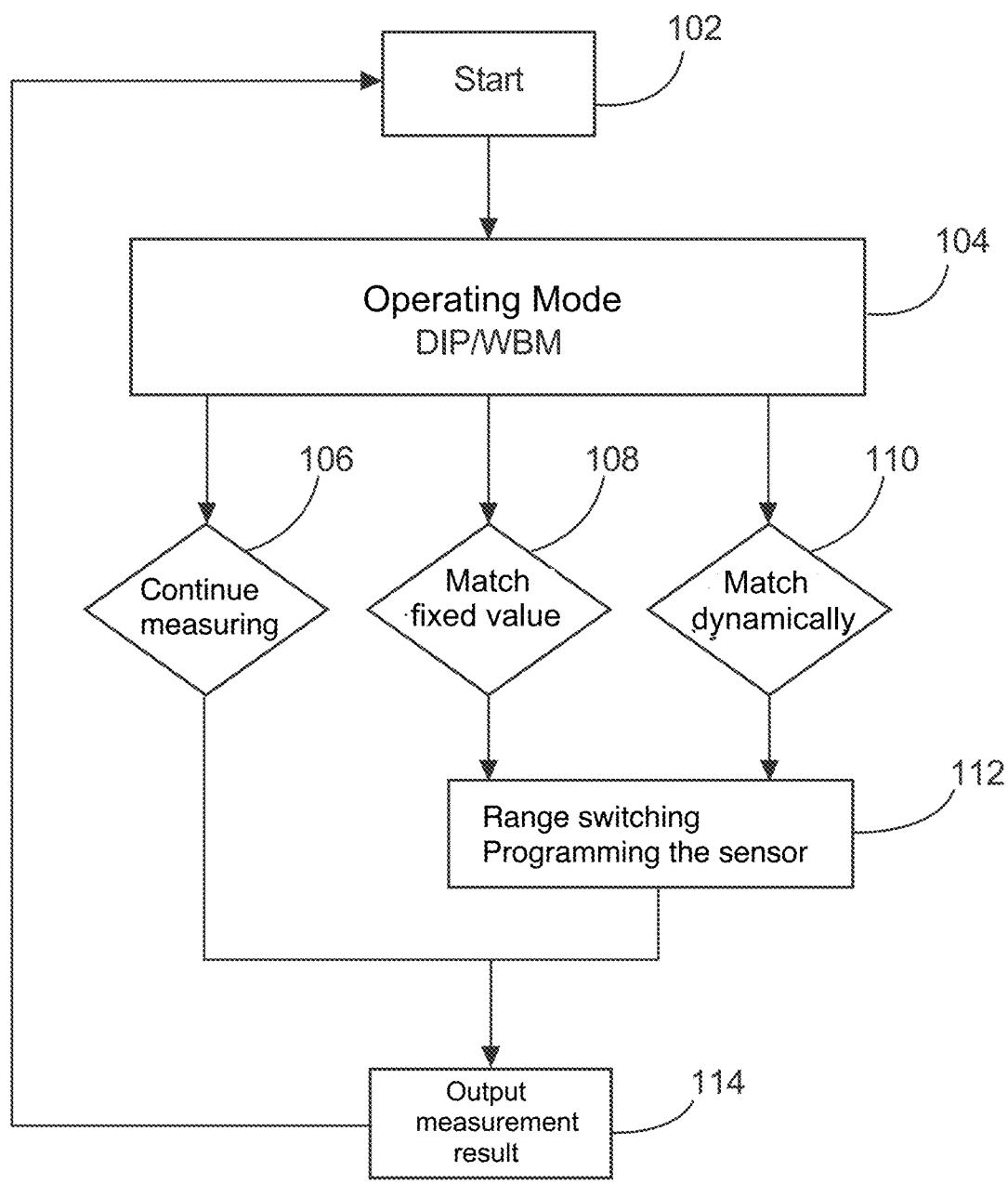
FIG. 6 shows a program flowchart, by means of which a measurement range switching can be performed by reprogramming a non-volatile memory in the current sensor of the current measurement apparatus.

FIG. 6 now shows the flow of the program 100, by means of which the matching of the current sensor 21 can be changed. It is transmitted to the PLC 30. The latter transmits the desired measurement range 0 . . . 10 A to the current measurement transducer 22. The program 100 is executed in the current measurement transducer 22. Reference numeral 102 identifies the start of the program. The user can adjust the matching via the workstation computer 50. He selects the measurement range 0 . . . 10 A for his desired application. What is to take place subsequently is selected in processing step 104. The following can be selected: performance of the normal measurement process, performance of a one-time matching process, and performance of a dynamic matching process. It is assumed thereby that the PLC 30 received the information to perform a one-time matching process. Step 108 is then selected thereby, by means of which the matching with a fixed value is initiated. The values to be programmed in are obtained from a table in step 108. The desired measurement range thereby serves as index for the table. The actual reprogramming takes place in step 112. The selected matching values are thereby written into the corresponding memory locations of the EEPROM memory 12 for the matching circuits 13, 14, 15. In step 114, the measurement results are subsequently transmitted to the PLC 30. When a measurement value is not yet available after reprogramming, no measurement result is output, and the program jumps back to the start of the program. Measurement values with the new matching values would then be acquired in the following run of the program and would be output to the PLC 30 in step 114. The third selection option corresponds to a dynamic matching, by means of which a new matching takes place in each case after a certain number of measurements. This dynamic matching corresponds to a dynamic measurement range switching, as it is also known from digital multimeters. An evaluation logarithm runs thereby, during which the acquired measurement values are analyzed in each case, and when the resulting current values were acquired with a resolution, which is too small, a resolution increase is effected by means of reprogramming.

It should be understood that the proposed method and the corresponding devices can be implemented in different forms of hardware, software, firmware, special processors, or a combination thereof. In a preferred variation, microcontrollers with integrated RAM memory and integrated I/O interfaces are used. Special processors can comprise application-specific integrated circuits (ASICs), reduced instruction set computer (RISC) and/or field programmable gate arrays (FPGAs). The proposed method and the device is preferably implemented as a combination of hardware and software. The software is preferably installed as an application program on a program storage device. This is typically a computer platform-based machine, which has hardware, such as, for example, one or several central units (CPU), a random access memory (RAM), and one or several input/output (I/O) interfaces (n). In addition, an operating system is furthermore typically installed on the computer platform. The different processes and functions described here can be part of the application program or a part, which is executed via the operating system.

The disclosure is not limited to the exemplary embodiments described here. There is room for different adaptations and modifications, which, based on his expert knowledge, the person of skill in the art would also consider as belonging to the disclosure.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

Current converter 10
Magnetic field sensor 11
Non-volatile memory 12
Offset matching circuit 13
Amplification matching circuit 14
Temperature matching circuit 15
Interface 16
Field concentrator 17
Current measurement apparatus 20
Current sensor 21
Current measurement transducer 22
Microcontroller 23
DIP switch 24
Communication interface 24'
Output unit 26
Controller 30
Frequency converter 40
Workstation computer 50
Electric motor 60
Field bus 70
Current supply line 80
Computer program 100
Various program steps 102-114

The invention claimed is:

1. A current measurement apparatus for measurement value acquisition, comprising:
   a current sensor; and
   a current measurement transducer,
   wherein a measurement range of the current sensor is adjustable,
   wherein the current sensor includes at least one magnetic field sensor comprising at least one matching circuit and a memory,
   wherein the current measurement transducer includes an input interface for inputting and/or a communication interface for transmitting information with respect to measurement range switching,
   wherein the current measurement transducer includes an output interface for outputting the measurement values, and
   wherein the measurement range switching for the current sensor is carried out during runtime and is based on the matching circuit accessing at least one new matching value in the memory, by which a change of the measurement signal of the magnetic field sensor is adjustable.

2. The current measurement apparatus of claim 1, wherein the at least one matching circuit corresponds to an amplifying circuit, an amplification factor of which is determined by the at least one new matching value in the memory.

3. The current measurement apparatus of claim 1, wherein the at least one matching circuit corresponds to a compensation circuit, a compensation value of which is determined by the at least one new matching value in the memory.

4. The current measurement apparatus of claim 3, wherein the compensation value corresponds to an offset value, by the which an offset of the measurement signal due to an occurrence of a production-related interfering direct current is compensated.

5. The current measurement apparatus of claim 3, wherein the compensation value corresponds to a correction value for a correction voltage, by which an offset of the measurement signal due to an occurrence of a temperature change is compensated.

6. The current measurement apparatus of claim 1, wherein the memory comprises to a non-volatile memory comprising EEPROM memory or flash EPROM memory or CMOS RAM memory.

7. The current measurement apparatus of claim 1, wherein the input interface comprises a selection switch and the communication interface comprises a field bus interface.

8. The current measurement apparatus of claim 1, wherein the magnetic field sensor comprises at least one Hall element.

9. The current measurement apparatus of claim 1, wherein the current measurement apparatus is configured to acquire a current generated by one or several solar modules.

10. A current sensor for the current measurement apparatus of claim 1, comprising:
 a magnetic field sensor comprising at least one matching circuit;
 a memory and an interface, via which at least one new matching value for the measurement range switching of the magnetic field sensor is receivable by a current measurement transducer; and
 a memory addressing unit, via which the at least one received matching value is writable into the memory.

11. The current sensor of claim 10, wherein the interface comprises a communication interface comprising an Inter-IC bus interface I2C.

12. A current measurement transducer for the current measurement apparatus of claim 1, comprising:
 a microcontroller;
 an output unit, via which measurement values are providable as digital or analog output;
 an input interface for inputting information with respect to the measurement range switching and/or a communication interface, via which data with respect to the measurement range switching is transmittable to the current measurement transducer;
 means for generating or for receiving via the communication interface at least one new matching value for the measurement range switching of a current sensor, which is connectable to the current measurement transducer; and
 an output interface for outputting the measurement values,
 wherein the microcontroller is configured to execute a computer program including programming steps, which, when executed by the microcontroller, prompt the microcontroller to send the at least one new matching value via a further interface to the current sensor.

13. The current measurement transducer of claim 12, wherein the further interface comprises a communication interface comprising an Inter-IC bus interface I2C.

14. The current measurement transducer of claim 12, wherein the communication interface comprises a field bus interface.

* * * * *